(12) United States Patent
Oono et al.

(10) Patent No.: US 7,333,565 B2
(45) Date of Patent: Feb. 19, 2008

(54) SEMICONDUCTOR INTEGRATED CIRCUIT FOR COMMUNICATION

(75) Inventors: Masachika Oono, Akiruno (JP); Hiroaki Matsui, Takasaki (JP); Koichi Yahagi, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 622 days.

(21) Appl. No.: 10/495,061

(22) PCT Filed: Oct. 16, 2002

(86) PCT No.: PCT/JP02/10715

§ 371 (c)(1),
(2), (4) Date: May 7, 2004

(87) PCT Pub. No.: WO03/043208

PCT Pub. Date: May 22, 2003

(65) Prior Publication Data

US 2005/0014476 A1    Jan. 20, 2005

(30) Foreign Application Priority Data

Nov. 14, 2001   (JP)   ............................. 2001-349165

(51) Int. Cl.
H04L 27/12    (2006.01)

(52) U.S. Cl. ...................... 375/307; 455/118; 375/308

(58) Field of Classification Search ................ 375/308, 375/307; 455/323, 326, 333, 118

See application file for complete search history.

(56) References Cited

U.S. PATENT DOCUMENTS

| | | | | |
|---|---|---|---|---|
| 4,926,147 A | * | 5/1990 | Oppelt | ......................... 334/81 |
| 4,954,769 A | * | 9/1990 | Kalthoff | ...................... 323/313 |

(Continued)

FOREIGN PATENT DOCUMENTS

| | | |
|---|---|---|
| JP | 9-275321 | 10/1997 |
| JP | 2001-44858 | 2/2001 |
| JP | 2001-211098 | 8/2001 |
| WO | WO 99/01933 | 1/1999 |

OTHER PUBLICATIONS

Author-Chung-Yu Wu, Fellow, IEEE and Hong-Sing Kao Student Member IEEE A 2-V Low-Power CMOS Direct-Conversion Quadrature Modulator with Integrated Quadrature Voltage-Controlled Oscillator and RF Amplifier for GHz RF Transmitter Applications Feb. 2002 Publisher-IEEE Transactions on Circuits and Systems-II: Analog and Digital Signal Processing vol. 49.*

*Primary Examiner*—Mohammed Ghayour
*Assistant Examiner*—Sonia J King
(74) *Attorney, Agent, or Firm*—Mattingly, Stanger, Malur & Brundidge, P.C.

(57) ABSTRACT

An orthogonal modulating circuit for modulating signals of two oscillation frequencies differing in phase by 90° with transmission data (I and Q) is used in common for a plurality of bands, an LC resonance circuit comprising inductances L and a capacitor C is used as the output load on the orthogonal modulating circuit instead of resistors commonly used according to the prior art, and the values of L or C constituting the resonance circuit are switched over between each other according to the transmission band.

1 Claim, 12 Drawing Sheets

U.S. PATENT DOCUMENTS

| | | | |
|---|---|---|---|
| 6,029,052 A * | 2/2000 | Isberg et al. | 455/131 |
| 6,169,441 B1 * | 1/2001 | Tihanyi | 327/427 |
| 6,806,767 B2 * | 10/2004 | Dow | 330/51 |
| 6,909,882 B2 * | 6/2005 | Hayashi et al. | 455/84 |
| 7,116,950 B2 * | 10/2006 | Tanaka et al. | 455/125 |
| 2004/0043727 A1 * | 3/2004 | Sato | 455/102 |

* cited by examiner

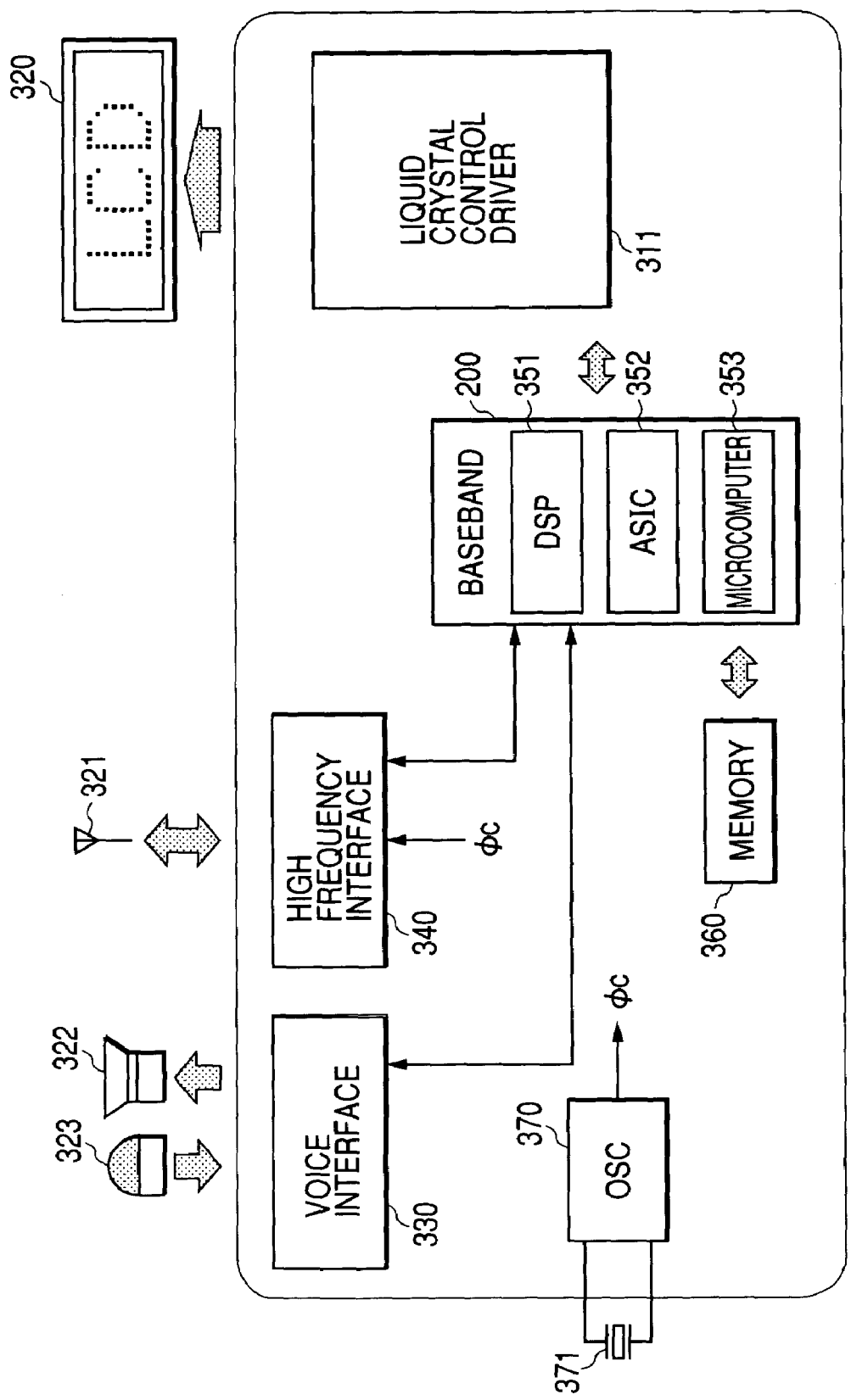

SEMICONDUCTOR INTEGRATED CIRCUIT FOR COMMUNICATION

CROSS-REFERENCE TO RELATED APPLICATION

The present application claims priority from Patent Cooperation Treaty patent application PCT/JP02/010715 filed on Oct. 16, 2002, the content of which is hereby incorporated by reference into this application.

TECHNICAL FIELD

The present invention relates to a technique that can be effectively applied to a semiconductor integrated circuit for communication for use in wireless communication apparatuses of a direct conversion formula, and more particularly to a technique that can be effectively applied to a modulating circuit and a demodulating circuit constituting a cellular phone or the like that can transmit and receive signals of a plurality of bands.

BACKGROUND ART

For a communication apparatus, such as a cellular phone, reductions not only in size and weight but also in cost are keenly called for. This cost saving can be effectively accomplished by reducing such external parts as a voltage control oscillator (VCO) and a SAW filter. According to the Global System for Mobile Communications (GSM), which is one of the digital mobile phone systems currently used in Europe, the main stream is an offset PLL formula, which does not use the expensive SAW filter. On the other hand, there is a direct conversion formula according to which high frequency oscillation signals, which constitute the carrier, are directly modulated with transmission data. This direct conversion formula would permit a further saving in cost because the IF-VCO, which generates oscillation signals of an intermediate frequency, can be eliminated.

In recent years, cellular phones have come to be required to have a dual band formula capable of handling signals of two frequency bands, such as the GSM of the 880 to 915 MHz band and the digital cellular system (DCS) of the 1710 to 1785 MHz band, or a triple band formula capable of handling signals of the personal communication system (PCS) of the 1850 to 1910 MHz band in addition to the GSM and the DCS. Conceivably, cellular phones will be required to be adaptable to even more bands in the future.

In a semiconductor integrated circuit (hereinafter referred to as a modulating/demodulating LSI) for modulating transmission signals and reception signals for use in such a cellular phone adaptable to a plurality of bands, providing a modulating circuit and a demodulating circuit for handling signals of each of the multiple bands would entail the problem of an increased circuit area and accordingly a higher chip cost. In view of this problem, it is conceivable to have the plurality of bands to use a modulating circuit and a demodulating circuit in common. However, an attempt at common use of a modulating circuit and a demodulating circuit would encounter difficulty to satisfy the requirements regarding the output level and noise characteristics.

More specifically, in the transmission circuitry for instance, if a conventional orthogonal modulating circuit having a resistor as the load element is used as it is, it will be difficult to keep the level of noise leaking into the reception frequency band (C/N ratio) as low as required. In the reception circuitry on the other hand, common use of mixers at a later stage by multiple bands would allow the output signal of the low noise amplifier (LNA) of the selected band to leak into the output of the LNAs of unselected bands, resulting in a drop in the output level of the LNA of the selected band and accordingly a deterioration in noise figure (NF) when amplification is performed by the mixer at a subsequent stage.

An object of the present invention is to provide a semiconductor integrated circuit for communication equipped with a modulating circuit capable of satisfying the noise characteristic requirement (C/N ratio) when an orthogonal modulating circuit is used in common by a plurality of bands to be adaptable to those multiple bands in the transmission circuitry of a direct up conversion formula with a view to restraining an increase in chip area.

Another object of the invention is to provide a semiconductor integrated circuit for communication equipped with a demodulating circuit capable of avoiding a deterioration in noise figure (NF) when a mixer for demodulating reception signals is used in common by a plurality of bands to be adaptable to those multiple bands in the reception circuitry of a direct down conversion formula with a view to restraining an increase in chip area.

Still another object of the invention is to provide a semiconductor integrated circuit for communication capable of communication over a plurality of bands and, moreover, requiring neither a SAW filter nor an IF-VCO for generating oscillation signals of an intermediate frequency, both of which would be external parts, and thereby enabling the number of constituent parts required to be reduced.

The above-stated and other objects and novel features of the invention will become more apparent from the following description in the specification when taken in conjunction with the accompanying drawings.

DISCLOSURE OF THE INVENTION

Typical aspects of the invention disclosed in the present application will be briefly described below.

Thus according to the invention, in a transmission circuitry of a direct up conversion formula, an orthogonal modulating circuit for modulating signals of two oscillation frequencies differing in phase by 90° with transmission data (I and Q) is used in common for a plurality of bands, an LC resonance circuit comprising inductances L and a capacitor C is used as the output load on the orthogonal modulating circuit instead of resistors commonly used according to the prior art, and the values of L or C constituting the resonance circuit are switched over between each other according to the transmission band. Resistors, if used as the output load on the orthogonal modulating circuit, would invite a voltage drop and narrow the dynamic range of the orthogonal modulating circuit, making it difficult to achieve a large output amplitude. By contrast, the use of the LC resonance circuit as the output load would invite no voltage drop and make it possible to achieve a high output level. Therefore, if the absolute quantity of noise is the same, common use of the orthogonal modulating circuit by multiple bands will not obstruct improvement of noise characteristic (C/N ratio).

While the resonance point of the LC resonance circuit can be altered by varying the value of L or of C, but it is simpler in the current process to vary the value of C. Further, as the capacitor C to serve as a constituent element of the resonance circuit, a gate capacitor between the gate terminal and the source-drain terminal of an insulating gate type field effect transistor (hereinafter referred to as MOSFET) can be utilized. This would enable a capacitor having large capacitance per unit area to be obtained without increasing the required steps of the manufacturing process and to restrain an increase in chip size.

According to another aspect of the invention under the present application, in a reception circuitry of a direct down conversion formula, wherein data signals are directly demodulated by mixing with reception signals oscillation signals of substantially the same frequency as that of the carrier of the reception signals' band, a first stage low noise amplifier (LNA) for amplifying reception signals is provided for each stage. At the same time, mixers serving as the demodulating circuit are used in common for the plurality of bands, and a buffer which takes on a high output impedance in their unselected state is provided between the LNA of each band and the common mixers.

As the means described above can prevent the output signal of the LNA of the selected band from leaking into the output of the LNAs of unselected bands, and thereby preventing inviting a drop in the output level of the LNA of the selected band, a deterioration in noise figure (NF) of the whole reception circuitry can be avoided.

Preferably, where the low noise amplifier (LNA) of each band is of a differential type, a switching element for short circuiting can be provided between its differential input terminals, and the differential input terminals of the LNAs of unselected bands can be placed at the same potential. This would make it possible to prevent reception signals and noise having infiltrated from the input side of the LNA of the selected band from leaking out to the output side of the LNA of the selected band and thereby preventing deterioration of noise characteristics.

BRIEF DESCRIPTION OF THE DRAWINGS

FIG. 13 is a block diagram of schematic configuration of a cellular phone as an example of wireless communication system using the modulating/demodulating LSI pertaining to the invention.

BEST MODE FOR CARRYING OUT THE INVENTION

Next will be described preferred embodiments of the present invention with reference to the accompanying drawings.

Figure 1:
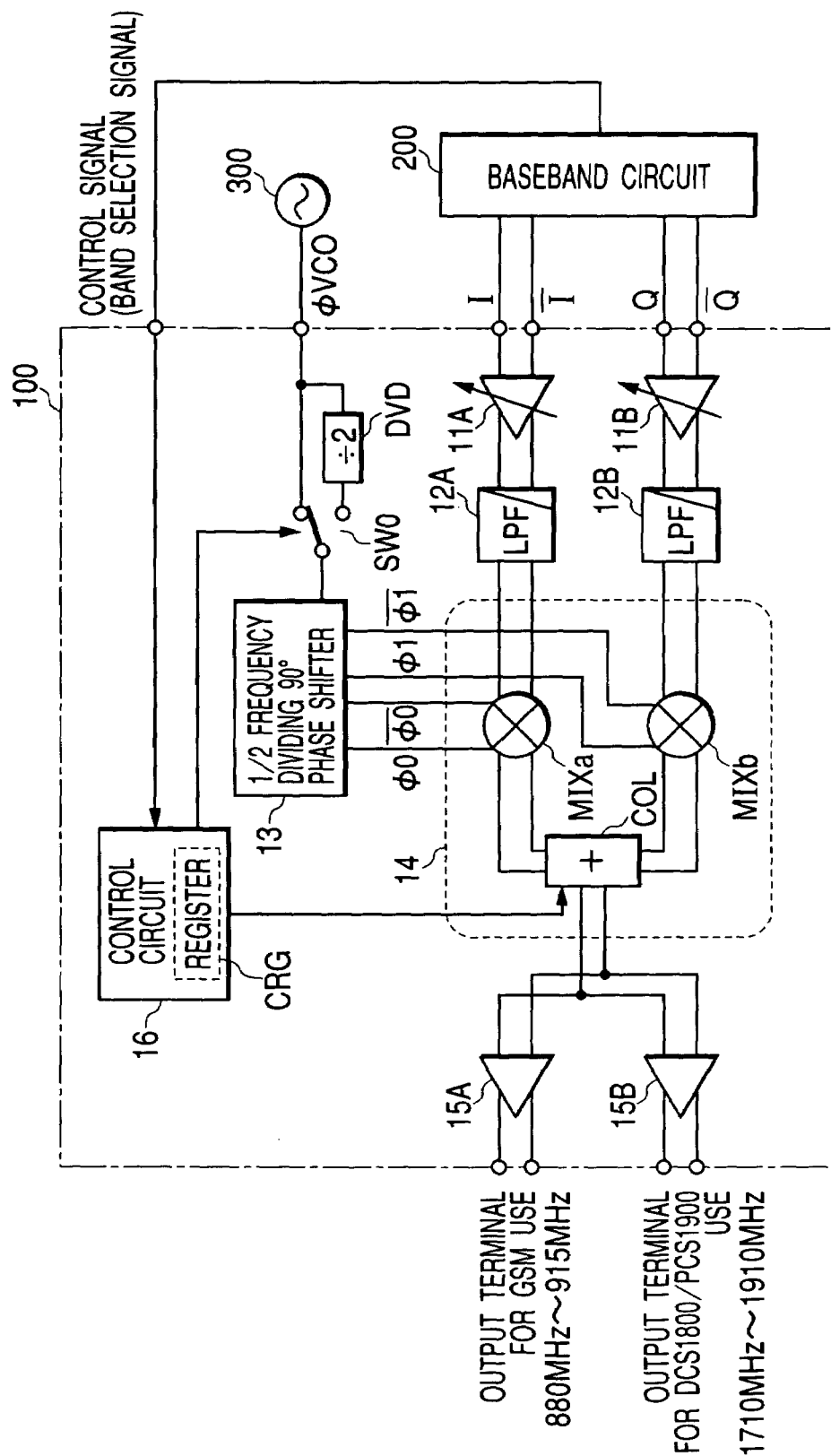
FIG. 1 is a block diagram of an example of transmission circuitry, to which the present invention is applied.

FIG. 1 shows a first preferred embodiment of the invention, which is a transmission circuitry of a direct up conversion formula.

In FIG. 1, reference numeral 100 denotes a semiconductor integrated circuit for communication use (hereinafter referred to as a modulating/demodulating LSI) in the transmission circuitry embodying the invention; 200, a baseband circuit; and 300, a local voltage control oscillator (VCO) generating a local oscillation signal. The baseband circuit 200 converts transmission data into I signals and Q signals and supplies them to the modulating/demodulating LSI 100, and generates control signals for the modulating/demodulating LSI 100. It consists of one or a few semiconductor integrated circuits (IC). The I and Q signals may be, though not necessarily are, supplied as differential signals I, /I, Q and /Q to the modulating/demodulating LSI 100. The local VCO 300 can generate a local oscillation signal $\phi$vco of 3.42 to 3.98 GHz in frequency, and oscillates at a frequency matching the selected band in response to a switch-over signal from the baseband circuit 200.

The transmission circuitry comprises attenuators 11A and 11B for converting I and Q signals from the baseband circuit 200 into signals of a prescribed level, low-pass filters 12A and 12B for clearing the I and Q signals of high frequency noise, a frequency dividing phase shifter circuit 13 for dividing the frequency of the local oscillation signal $\phi$vco from the local VCO 300 by ½ and generating oscillation signals $\phi$1 and $\phi$0 differing in phase from each other by 90°, an orthogonal modulating circuit 14 for subjecting the oscillation signals $\phi$1 and $\phi$0 to orthogonal modulation with the I and Q signals, an amplifier circuit 15A connected to an output terminal for GSM, an amplifier circuit 15B connected to an output terminal for DCS1800/PCS1900, and a control circuit 16 for controlling the inside of the modulating/demodulating LSI. Though not shown, a reception circuitry is also provided within the modulating/demodulating LSI 100.

The levels of attenuation by the attenuators 11A and 11B are controlled with control signals from the control circuit 16. Since the output levels of the I and Q signals differ in some of the baseband circuits currently available for practical use, the attenuation levels of the attenuators 11A and 11B are so adjusted that the levels of the I and Q signals supplied to the orthogonal modulating circuit 14 be constant irrespective of whatever baseband circuit may be used. This adjustment of the attenuation levels of the attenuators 11A and 11B is accomplished in accordance with a value set in advance by the baseband circuit 200 to a register CRG in the control circuit 16. Into the register CRG in the control circuit 16 is also set by the baseband circuit 200 information designating the band to be used.

As a frequency dividing circuit DVD for dividing the frequency of the oscillation signal $\phi$vco by ½ and a change-over switch SW0 for changing over the frequency-divided signal or the signal before the frequency division are provided in the modulating/demodulating LSI 100, the oscillation signal φvco of the local VCO 300 is used as a common oscillation signal for GSM, DCS1800 and PCS1900. Thus, a signal resulting from ½ frequency division of the oscillation signal φvco by the frequency dividing circuit DVD is used for GSM, and the oscillation signal before the frequency division is used for DCS1800/PCS1900.

The change-over switch SW0 performs changing over in accordance with a control signal from the control circuit 16. The control circuit 16 supplies a signal to switch over the change-over switch SW0 on the basis of information on band designation set in a register. Changing over the oscillation frequency of the local VCO 300 at an instruction from the baseband circuit 200 according to the band to be used causes the transmission frequency to be switched over.

The orthogonal modulating circuit 14 comprises a mixer MIXa for mixing the I signal from the baseband circuit 200 and oscillation signals φ0 and /φ0 from the frequency dividing phase shifter circuit 13, a mixer MIXb for mixing the Q signal from the baseband circuit 200 and oscillation signals φ1 and /φ1 from the frequency dividing phase shifter circuit 13, and a common output load COL on these mixers.

Further in this embodiment of the invention, the orthogonal modulating circuit 14 is disposed to be commonly used for each band, and the output of the orthogonal modulating circuit 14 is supplied to both the amplifier circuit 15A for GSM and the amplifier circuit 15B for DCS1800/PCS1900. As DCS1800 and PCS1900 are close to each other in frequency band, only one amplifier circuit 15B is shared by the two bands in this embodiment, but one separate amplifier circuit may as well be provided for each.

Figure 2:
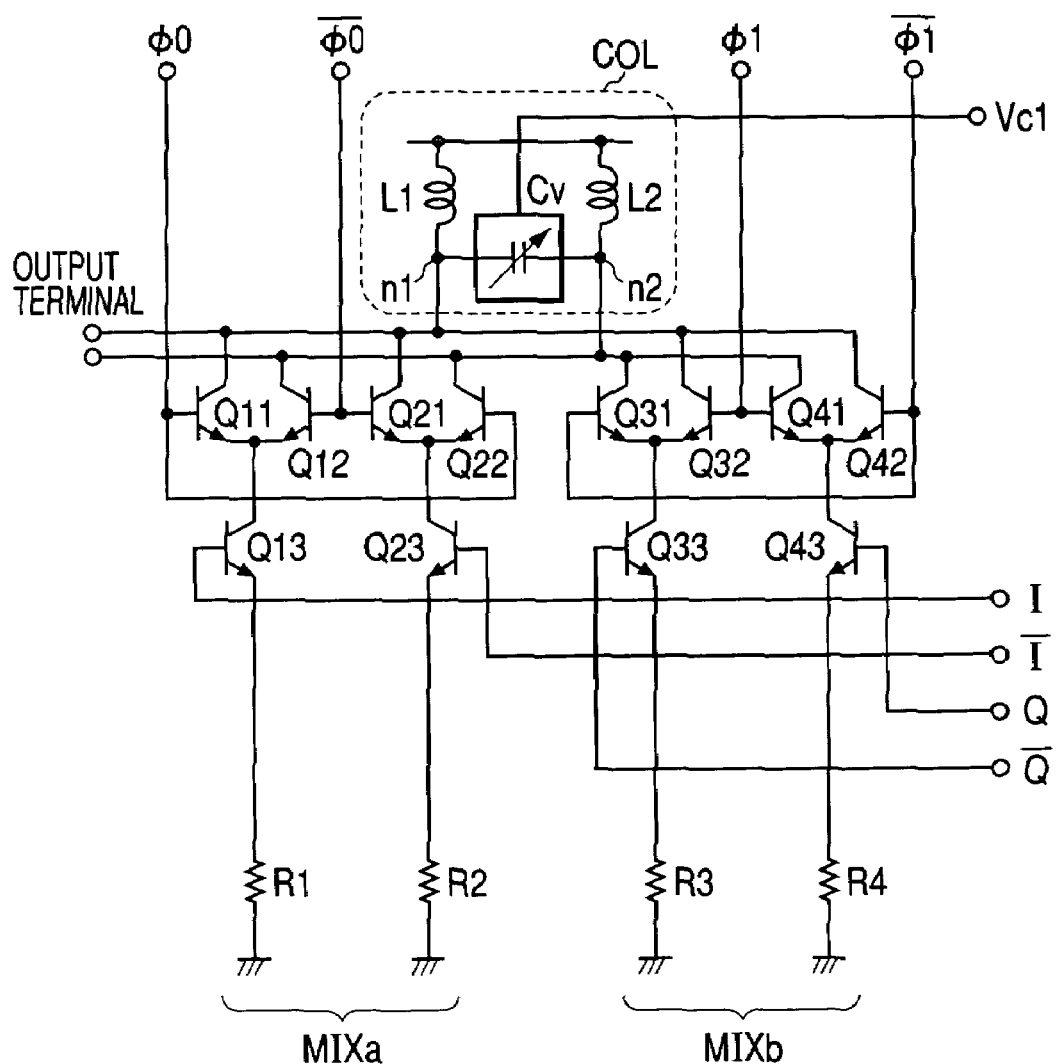
FIG. 2 is a circuit diagram of a first typical configuration of an orthogonal modulating circuit constituting the transmission circuitry embodying the invention.

FIG. 2 shows a specific example of configuration of the orthogonal modulating circuit 14. As shown in FIG. 2, the orthogonal modulating circuit 14 of this embodiment, the common output load COL is composed of a pair inductances L1 and L2 arranged in parallel and a variable capacitor Cv. The variable capacitor Cv is connected between one terminal each (nodes n1 and n2) of the inductances L1 and L2, and a control voltage Vc1 for controlling the capacitance of this variable capacitor Cv is generated on the basis of the information on band designation set in the aforementioned register in the control circuit 16. More specifically, the control voltage Vc1 is so generated that the capacitance of the variable capacitor Cv be raised when in the GSM transmission mode and lowered when in the DCS1800 or PCS1900 transmission mode.

To add, an arrangement in which a plurality of capacitance elements are provided in parallel and the capacitance element to be connected is selected with a switch is also conceivable as an alternative to the configuration in which the capacitance is changed over by varying the voltage applied to one terminal of the variable capacitor Cv as in this embodiment, the design would have to reflect advance consideration for the resistance component of the selector switch because the resonance point would vary according to the relative magnitude of this resistance component. Therefore, it is more advantageous in terms of designing ease to change over the capacitance by varying the voltage Vc1 applied to one terminal of the variable capacitor Cv as in this embodiment.

The mixer MIXa is configured of transistors Q11, Q12, Q21 and Q22 to whose bases are supplied an oscillation signal φ0 from the frequency dividing phase shifter circuit 13 and an oscillation signal /φ0 off the oscillation signal φ0 in phase by 180° and whose emitters are commonly connected, a transistor Q13 which is connected to the common emitter of the transistors Q11 and Q12 and whose base terminal is supplied with the I signal from the baseband circuit 200, a transistor Q23 which is connected to the common emitter of the transistors Q21 and Q22 and whose base terminal is supplied with a reversed-phase signal /I to the I signal from the baseband circuit 200, and emitter resistances R1 and R2 of the transistors Q13 and Q23. The collector terminals of the transistors Q11 and Q21 are connected to the connecting node n1 for the inductance L1 and the variable capacitor Cv of the common output load COL, and the collector terminals of the transistors Q12 and Q22 are connected to the connecting node n2 for the inductance L2 and the variable capacitor Cv.

The mixer MIXb is configured of transistors Q31, Q32, Q41 and Q42 to whose bases are supplied an oscillation signal φ1 from the frequency dividing phase shifter circuit 13 and an oscillation signal /φ1 off the oscillation signal φ1 in phase by 180° and whose emitters are commonly connected, a transistor Q33 which is connected to the common emitter of the transistors Q31 and Q32 and whose base terminal is supplied with the Q signal from the baseband circuit 200, a transistor Q43 which is connected to the common emitter of the transistors Q41 and Q42 and whose base terminal is supplied with a reversed-phase signal /Q to the Q signal from the baseband circuit 200, and emitter resistances R3 and R4 of the transistors Q33 and Q43. The collector terminals of the transistors Q31 and Q41 are connected to the connecting node n2 for the inductance L2 and the variable capacitor Cv of the common output load COL, and the collector terminals of the transistors Q32 and Q42 are connected to the connecting node n1 for the inductance L1 and the variable capacitor Cv.

Figure 3:
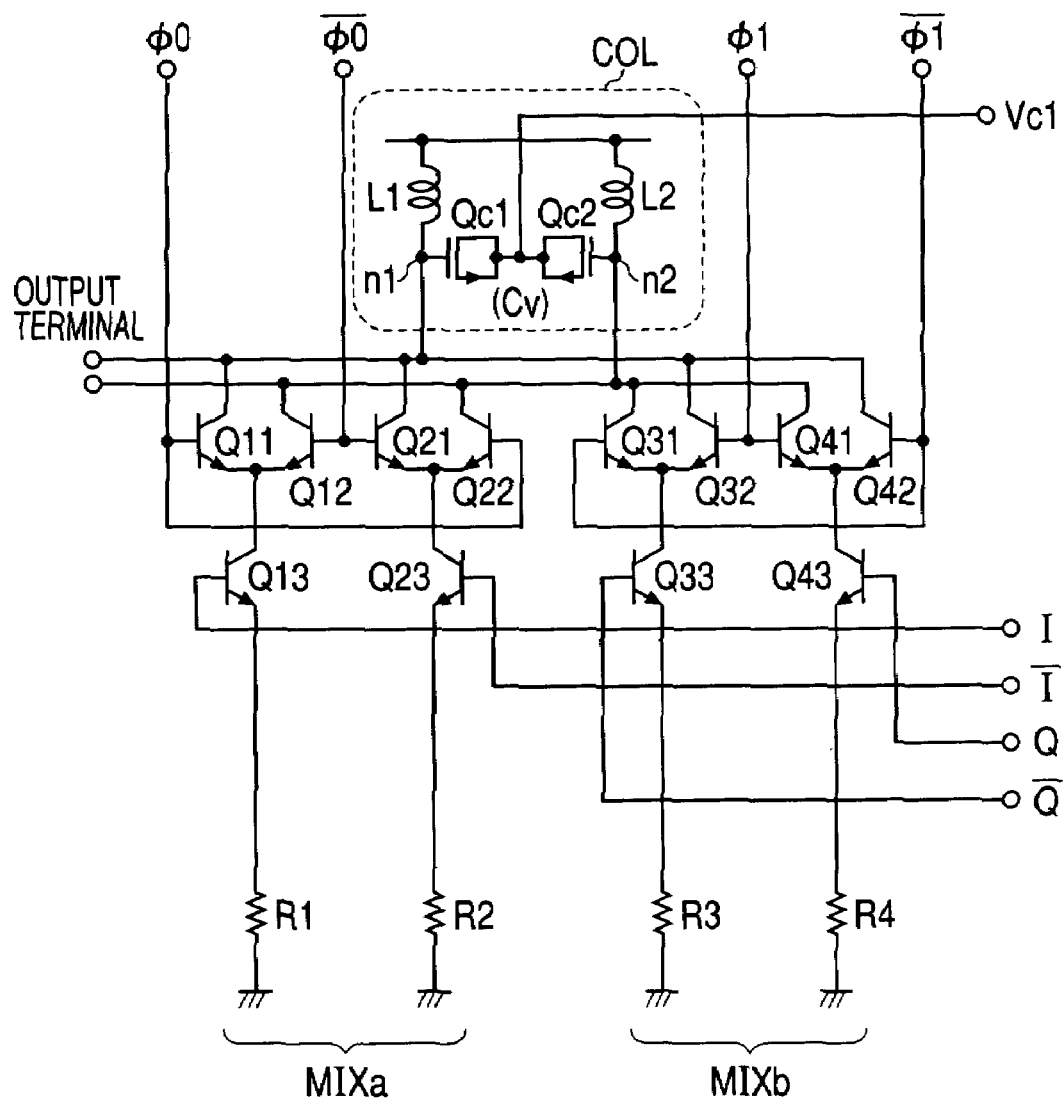
FIG. 3 is a circuit diagram of a second typical configuration of an orthogonal modulating circuit constituting the transmission circuitry embodying the invention.

FIG. 3 is a circuit diagram showing in a more specific way the variable capacitor Cv of the orthogonal modulating circuit 14 shown in FIG. 2. The orthogonal modulating circuit 14 in this embodiment uses the gate capacities of MOSFETs Qc1 and Qc2 as the variable capacitor Cv constituting part of the common output load COL. Where the modulating/demodulating LSI in this embodiment has, as an internal circuit, what consists of a so-called Bi-CMOS circuit composed of a bipolar transistor and MOSFETs, the variable capacitor Cv can be formed without increasing the required steps of the manufacturing process by using the gate capacities of the MOSFETs as the variable capacitor Cv as stated above. Furthermore, as the gate capacities of MOSFETs are relatively large in capacitance per unit area, a substantial increase in chip size can be restrained even where the inductances L1 and L2 and the variable capacitor Cv are provided in place of the resistors in conventional mixers.

Figure 4:
FIG. 4 is a graph showing the relationship between the control voltage for the variable capacitor and the capacitance of a resonance circuit as the output load of the orthogonal modulating circuit.

FIG. 4 shows the relationship between the capacitance of the variable capacitor Cv and the control voltage for controlling it. In FIG. 4, a broken line A represents the variation of the capacitance in a case wherein the variable capacitor Cv is composed of one MOSFET whose W/L ratio (the ratio between the gate width and the gate length) is 16 μm/2 μm, and a solid line B, a case wherein it is composed of 24 MOSFETs whose W/L ratio is 16 μm/2 μm. If the capacitance per MOSFET when a voltage of 1.5 V or above is applied to the gate is 0.125 pF, a total capacitance of 3 pF will be obtained where 24 MOSFETs are connected in parallel. Therefore, the number of MOSFETs to constitute the common output load COL or the gate width can be set according to the capacitance required by the common output load COL.

Figure 5:
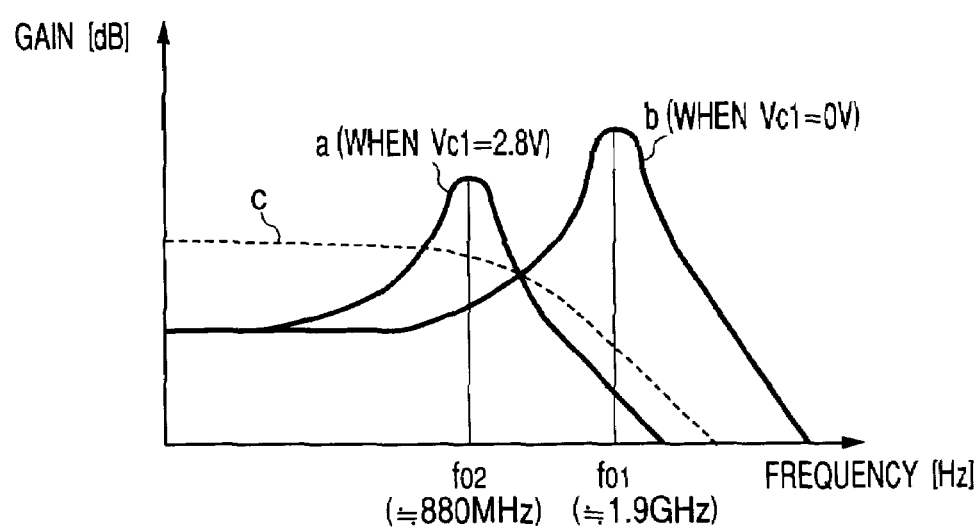
FIG. 5 is a graph showing the frequency characteristic of the orthogonal modulating circuit in the embodiment of the invention.

FIG. 5 shows the frequency characteristic of the orthogonal modulating circuit 14 of FIG. 2 when the capacitance of the variable capacitor Cv and the control voltage Vc1 for controlling it are switched over to 0 V and 2.8 V. In FIG. 5, a curve a represents the characteristic where 2.8 V is applied as the control voltage Vc1, and a curve b, where 0 V is applied as the control voltage Vc1 . The frequencies fo2 and fo1 at the peaks of the respective curves are the resonance points of the common output load COL consisting of an LC resonance circuit. In this embodiment, the capacitance of the variable capacitor Cv is so set that these frequencies fo2 and fo1 come close to the 900 MHz of GSM and 1800 MHz of DCS/PCS, respectively. To add, a broken curve c in FIG. 5 represents the frequency characteristic of the orthogonal modulating circuit 14 wherein a resistor is used as the common output load COL. By comparing these characteristics, it will be seen that the gain of the orthogonal modulating circuit 14 can be increased in the vicinities of the desired frequencies fo2 and fo1.

Figure 6:
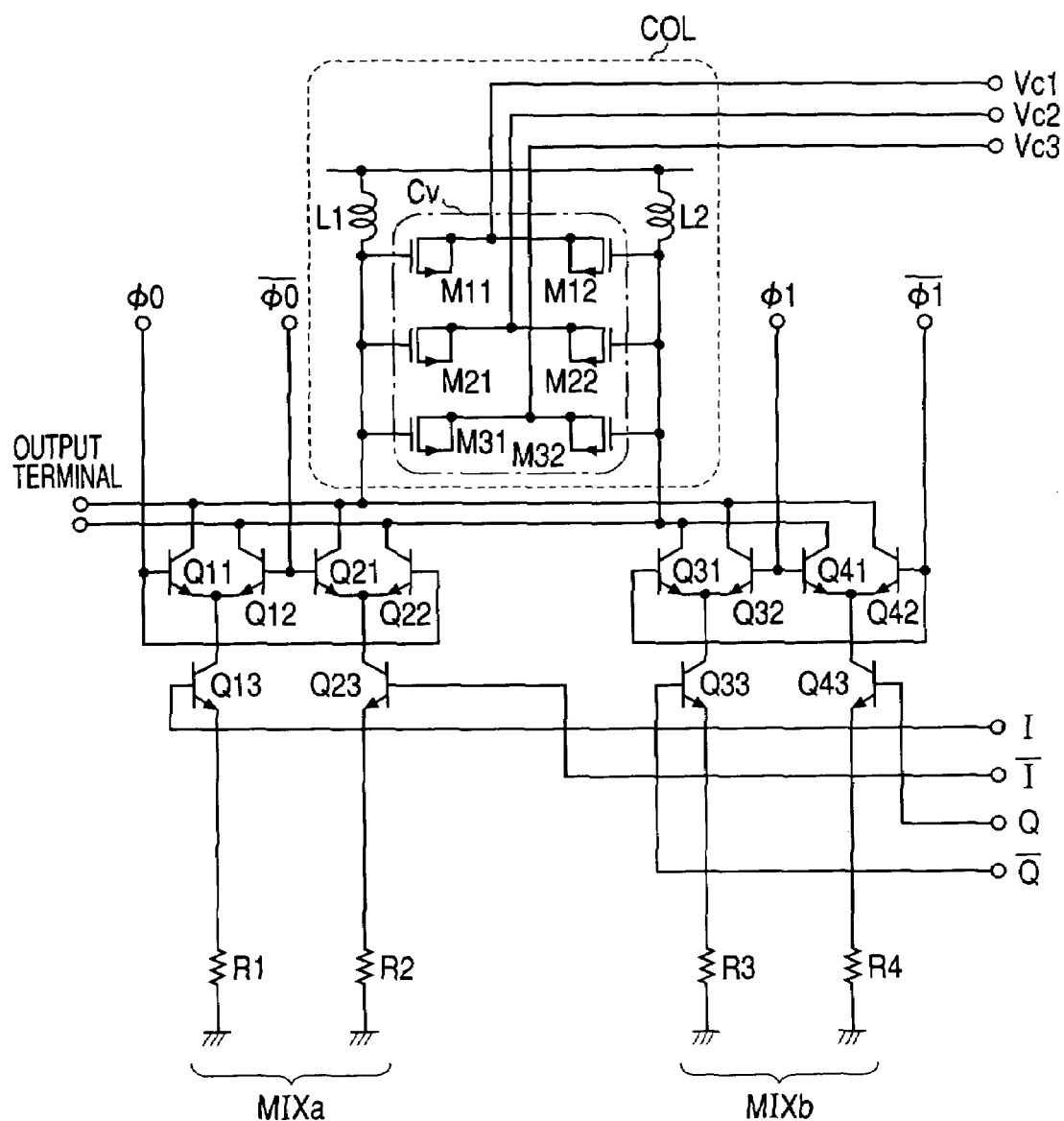
FIG. 6 is a circuit diagram of a third typical configuration of an orthogonal modulating circuit constituting the transmission circuitry embodying the invention.

FIG. 6 shows another example of circuitry for the orthogonal modulating circuit 14 of FIG. 2. The orthogonal modulating circuit 14 in this example has three pairs of MOSFETs M11/M12, M21/M22 and M31/M32 as the variable capacitor Cv constituting the common output load COL, and is provided with separate control voltages Vc1, Vc2 and Vc3 to be applied to the source-drain terminals of each pair of MOSFETs so that the capacitance of the variable capacitor Cv consisting of the gate capacitances of the MOSFETs can be varied by eight steps by changing over these control voltages Vc1, Vc2 and Vc3. Table 1 shows the relationship between the control voltages Vc1, Vc2 and Vc3 and the capacitance of the variable capacitor Cv.

TABLE 1

| Vc3 | Vc2 | Vc1 | Capacitance of variable capacitor |
|---|---|---|---|
| L | L | L | 0 |
| L | L | H | Cva |
| L | H | L | Cvb |
| L | H | H | Cva + Cvb |
| H | L | L | Cvc |
| H | L | H | Cva + Cvc |
| H | H | L | Cvb + Cvc |
| H | H | H | Cva + Cvb + Cvc |

In Table 1, Cva represents the gate capacitance of the MOSFETs M11 and M12 when the control voltage Vc1 to be applied to the source-drain terminals of the MOSFETs M11 and M12 is set to a high level "H", such as 2.8 V; Cvb, the gate capacitance of the MOSFETs M21 and M22 when the control voltage Vc2 Vc1 to be applied to the source-drain terminal of the source-drain terminals of the MOSFETs M21 and M22 is set to the high level "H"; and Cvc, the gate capacitance of the MOSFETs M31 and M32 when the control voltage Vc3 to be applied to the source-drain terminal of the MOSFETs M31 and M32 is set to the high level "H". A frequency characteristic appropriate for the band to be used can be provided to the orthogonal modulating circuit 14 by so switching over the control voltages Vc1, Vc2 and Vc3 as to select the most suitable one out of these capacitances according to the frequency band to be used.

Next will be described an example of reception circuitry to which the present invention is applied.

Figure 7:
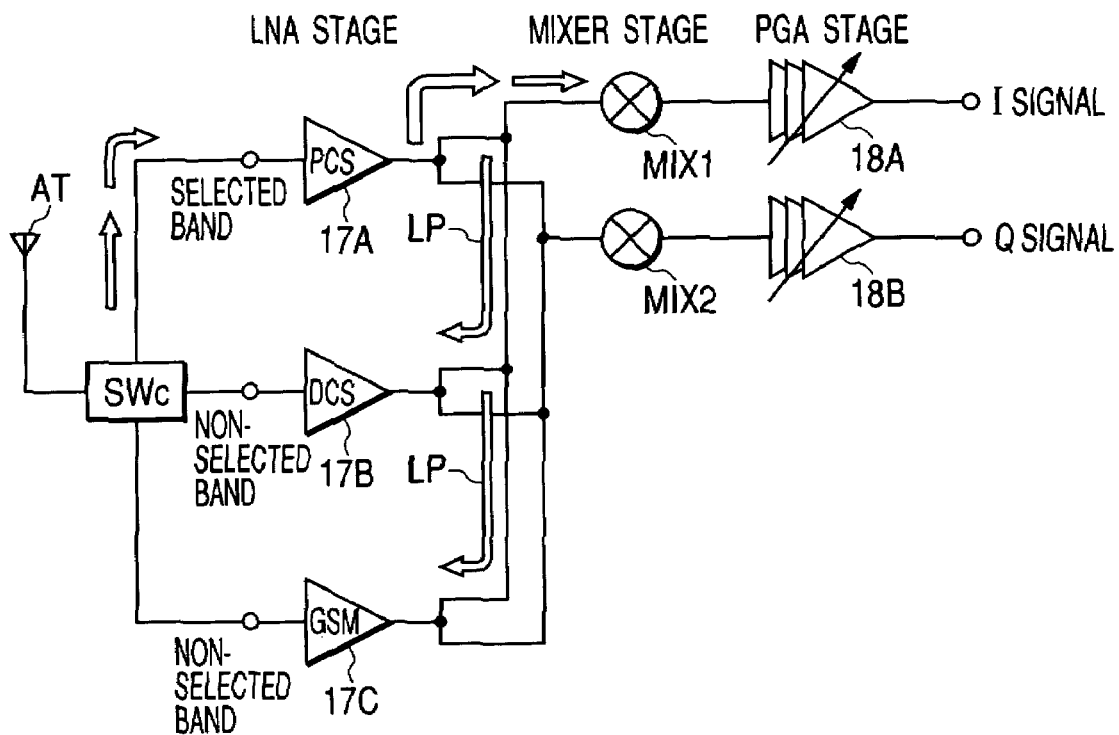
FIG. 7 illustrates an example of reception circuitry studied prior to the present invention and problems involved in it.

In configuring a reception circuitry adaptable to dual bands or triple bands, a mixer for mixing reception signals and local oscillation signals is usually provided for each individual band. However, this entails enlarged circuit dimensions and an increased chip size. In view of this problem, the present inventors considered arrangement of a low noise amplifier (LNA) for each individual band, as represented by 17A through 17C in FIG. 7, and sharing of mixers MIX1 and MIX2 and programmable gain amplifiers (PGAs) 18A and 18B at subsequent stages by the plurality of bands.

As a result, for instance in a case wherein reception signals from an antenna AT are input the LNA 17A via a change-over switch SWc according to the selected band, part of the output of the selected LNA 17A leaks into the other unselected LNAs 17B and 17C to invite a drop in the output level of the selected LNA 17A. It was found out that the amplification of this reduced output of the LNA 17A by the mixers MIX1 and MIX2 would entail a deterioration in NF in the whole reception circuitry. It was also discovered that, since the frequency of reception signals differs from band to band, the extent of the LNA output drop also differs from band to band, and the NF value is varied by a band switch-over.

Figure 8:
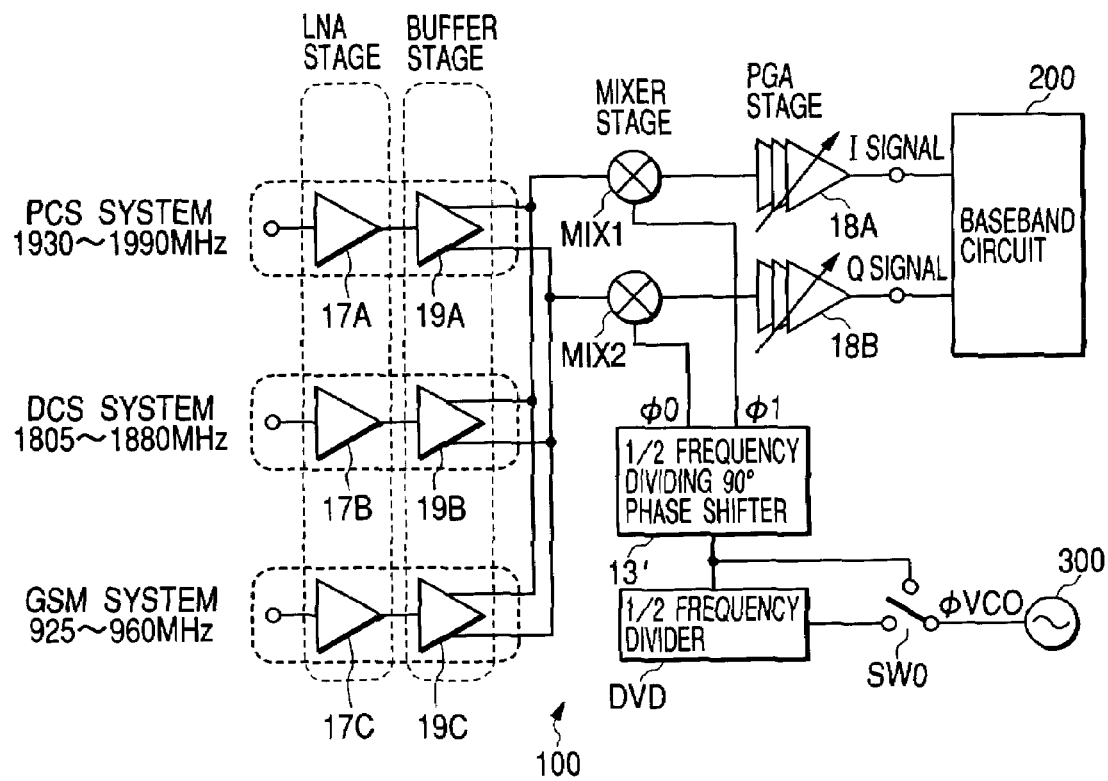
FIG. 8 is a block diagram of a first example of reception circuitry to which the invention is applied.

FIG. 8 shows an example of reception circuitry of the direct down conversion formula which embodies the invention. It differs from the circuitry of FIG. 7 in that buffers 19A, 19B and 19C whose output impedances are high when not selected are provided at a stage subsequent to the LNA 17A through LNA 17C, and the outputs of these buffers 19A through 19C are input the common mixers MIX1 and MIX2.

Incidentally, since the mixers MIX1 and MIX2 mix the reception signals with the oscillation signals φ1 and φ0 differing in phase from each other by 90°, supplied from the frequency dividing phase shifter circuit 13', the I signals and Q signals are thereby demodulated. Though not shown, a variable gain amplifier is provided at a stage preceding the mixers MIX1 and MIX2.

Though not limited to this arrangement, the band change-over switch SWc is so switched over that the LNA 17A amplify signals of PCS's 1900 MHz band, the LNA 17B amplify signals of DCS's 1800 MHz band, and the LNA 17C amplify signals of GSM's 900 MHz band.

Figure 9:
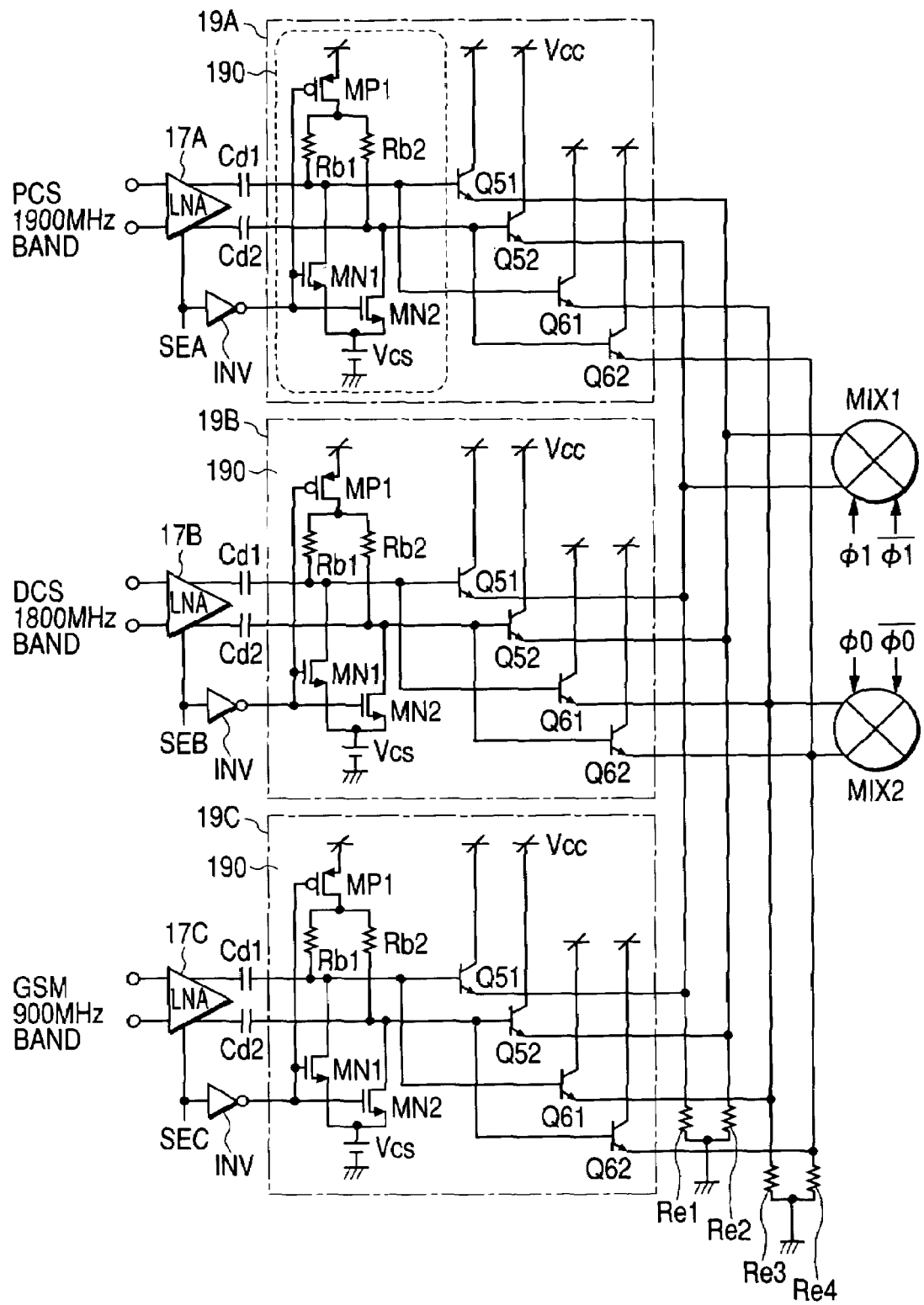
FIG. 9 is a circuit diagram of a typical example of configuration of a buffer circuit constituting the reception circuitry in the embodiment.

FIG. 9 shows in a more specific way the circuitry of the buffers 19A, 19B and 19C at a stage subsequent to the LNAs 17A, 17B and 17C for the different bands constituting the reception circuitry of FIG. 8. Since the buffers 19A, 19B and 19C have the same configuration, the following description of the configuration will focus on the buffer 19A.

As shown in FIG. 9, the buffer 19A (19B or 19C) is configured of collector-grounded type transistors Q51, Q52, Q61 and Q62 to whose bases the differential output of the LNA 17A (17B or 17C) are applied via capacitors Cd1 and Cd2 which cut the respective D.C. components and a biasing and selecting circuit 190 which provides base bias voltages to these transistors and selectively places one of them in an operating state according to the band that is to be used.

Between the transistors Q51 and Q52 of each of the buffers, the emitters are coupled to each other, connected to a grounding point via common emitter resistors Re1 and Re2. Between the transistors Q61 and Q62 of each buffer as well, the emitters are coupled to each other, connected to a grounding point via common emitter resistors Re3 and Re4. The potentials of the common emitters of the transistors Q51 and Q52 are input to the mixer MIX1. On the other hand, the potentials of the common emitters of the transistors Q61 and Q62 are input to the mixer MIX2.

The biasing and selecting circuit 190 is configured of resistors Rb1 and Rb2 connected to the bases of the transistors Q51 and Q52 of each of the buffers, a P-channel MOSFET MP1 connected between the connecting node for these resistors Rb1 and Rb2 and a source voltage terminal Vcc, and N-channel MOSFETs MN1 and MN2 whose drains are connected to the bases of the transistors Q51 and Q52 and each of the buffers. The sources of the N-channel MOSFETs MN1 and MN2 are coupled to each other, and to these common sources is applied a constant voltage Vcs set to be lower than the emitter voltage of the emitter follower transistors Q51 and Q52.

The P-channel MOSFET MP1 and the N-channel MOSFETs MN1 and MN2 are subjected to complementary on/off control by the output of a CMOS inverter INV which inverts selection signals SEA, SEB and SEC for the respectively matching LNAs 17A, 17B and 17C. The selection signals SEA, SEB and SEC are generated and supplied by the control circuit 16 on the basis of a value set in the register in the control circuit 16 of FIG. 2 from the baseband circuit.

Next will be described the actions of the buffers 19A through 19C. Supposed here is a case in which the LNA 17A is selected and the LNAs 17B and 17C are not. In this case, the selection signal SEA is set to a high level, and the signals SEB and SEC, to a low level. In the biasing and selecting circuit 190 at a stage subsequent to the selected LNA, the P-channel MOSFET MP1 is thereby turned on and the N-channel MOSFETs MN1 and MN2 turned off. This causes a D.C. bias potential close to the source voltage Vcc to be applied to the bases of the transistors Q51, Q52, Q61 and Q62, and the A.C. output of the LNA 17A (reception signal) is superposed over it to be inputted. As a result, an A.C. voltage matching the output of the LNA 17A is generated at the emitters of the transistors Q51 through Q62 of the buffer 19A for the selected band.

On the other hand, in the biasing and selecting circuits 190 of the buffers 19B and 19C at a stage subsequent to the LNAs 17B and 17C for unselected bands, the P-channel MOSFET MP1 is turned off and the N-channel MOSFETs MN1 and MN2 are turned on by the selection signals SEB and SEC. This causes a D.C. bias potential from a constant voltage source Vcs to the bases of the transistors Q51, Q52, Q61 and Q62 to turn off these transistors Q51 through Q62. In this state, even if the LNA for the selected band amplifies the reception signals to cause currents to flow to the emitter follower transistors Q51 through Q62 of the buffer to cause the emitter potential to vary, the variation is prevented from being conveyed to the output terminals of the inactive LNAs for the unselected bands. In other words, the output impedances of the unselected LNAs are raised. As a result, the level of the output from the LNA of the selected band to the mixers MIX1 and MIX2 is prevented from falling, and nor will there be a deterioration in NF value.

Figure 10:
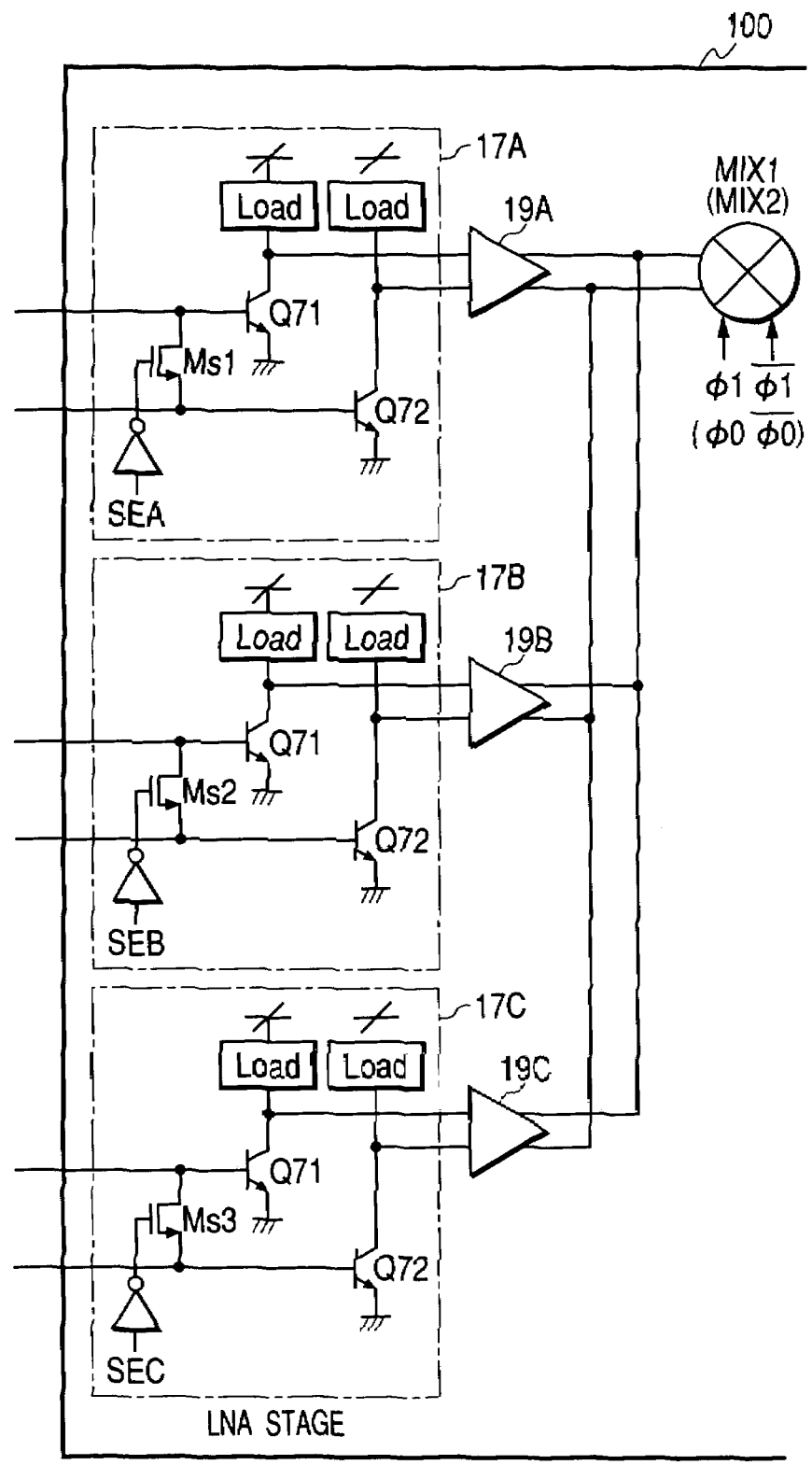
FIG. 10 is a circuit diagram of a typical example of configuration of a low noise amplifier (LNA) constituting the reception circuitry in the embodiment.

FIG. 10 shows another example of reception circuitry which embodies the invention.

In this embodiment, short-circuiting MOSFETs Ms1, Ms2 and Ms3 are provided between the base terminals of transistors Q71 and Q72 constituting LNAs 17A, 17B and 17C for multiple bands, and these MOSFETs Ms1, Ms2 and Ms3 are controlled with the selection signals SEA, SEB and SEC used for controlling the biasing and selecting circuit 190 in the above-described embodiment. At a stage subsequent to the LNAs 17A, 17B and 17C, the buffers 19A, 19B and 19C are provided as in the earlier embodiment.

In this embodiment, control is so effected that the short-circuiting MOSFET Ms of the LNA for the selected band be turned off, and the short-circuiting MOSFETs Ms of the LNAs for the unselected bands be turned on. While this causes the LNA for the selected band to engage in usual differential amplification, the LNAs for the unselected bands, as their differential input terminals are short-circuited between each other, are prevented from letting reception signals or noise having found their way into the input terminals of the LNAs for the unselected band be input to the mixers shared by the multiple bands.

Where the configuration is such that the output impedances of unselected LNAs are raised by providing the buffers 19A, 19B and 19C to improve the NF characteristic of the front end section of the reception circuitry as in the example shown in FIG. 8, the output nodes of the unselected LNAs are placed in a floating state and, conversely, made susceptible to the influence of noise from the input side, which might conceivably be input to the mixers via parasitic capacitors. However, the presence of the short-circuiting MOSFETs Ms on the input side of LNAs, which are turned on, can prevent noise having found its way into the LNAs for the unselected bands from being amplified and input into the mixers via the buffers whose output impedances have been raised. The NF characteristic is further improved as a result.

Figure 11:
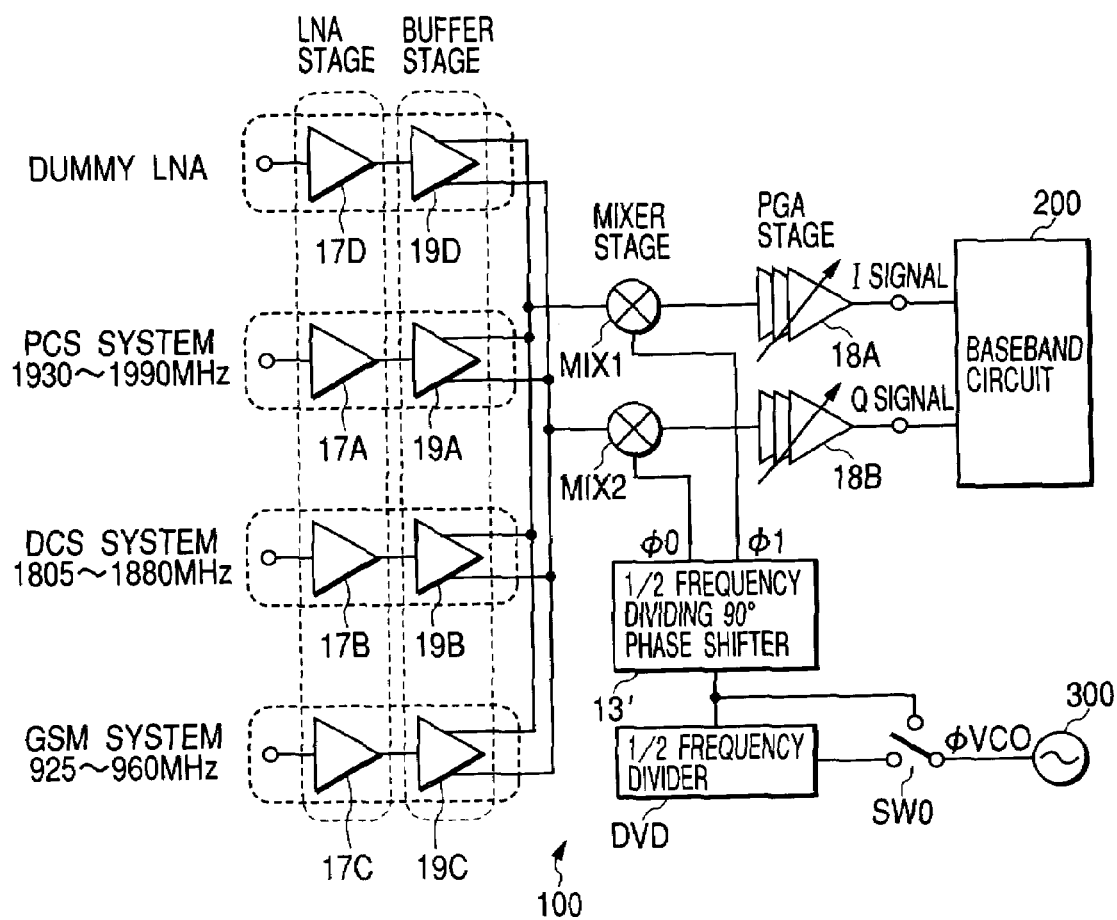
FIG. 11 is a block diagram of a second example of reception circuitry to which the invention is applied.

FIG. 11 shows still another example of reception circuitry which embodies the invention.

In this embodiment, apart from the LNAs 17A, 17B and 17C for multiple bands, a dummy LNA 17D and a dummy buffer circuit 19D of the same circuit configuration as their earlier described counterparts are provided on the input side of the common mixers MIX1 and MIX2. These dummy LNA 17D and dummy buffer circuit 19D effectively function where variable gain amplifiers (PGAs) 18A and 18B at a subsequent stage are provided with D.C. offset canceling circuits.

Thus, where the PGAs have offset canceling circuits, usually the LNAs 17A, 17B and 17C are placed in a non-operating state when D.C. offsets are calibrated in the PGAs 18A and 18B. However, since the LNAs are activated in an actual operation of reception, leaked noise or oscillation signals from the oscillator enter into the mixers via this activated selected LNA, the noise having infiltrated via the LNA would be self-mixed by the mixers to give rise of D.C. offsets in the absence of the dummy LNA 17D and the dummy buffer circuit 19D.

By contrast in this example of circuitry, by virtue of the presence of the dummy LNA 17D and the dummy buffer circuit 19D, it is possible to perform calibration in a state in which stray noise resulting from leaked noise or oscillation signal from the oscillator is given to the mixers via the dummy LNA by placing the genuine LNAs 17A, 17B and 17C in a non-operating state and instead performing calibration in the PGAs 18A and 18B in a state in which the dummy LNA 17D and the dummy buffer circuit 19D are activated. Accordingly, DC offsets are restrained.

Figure 12:
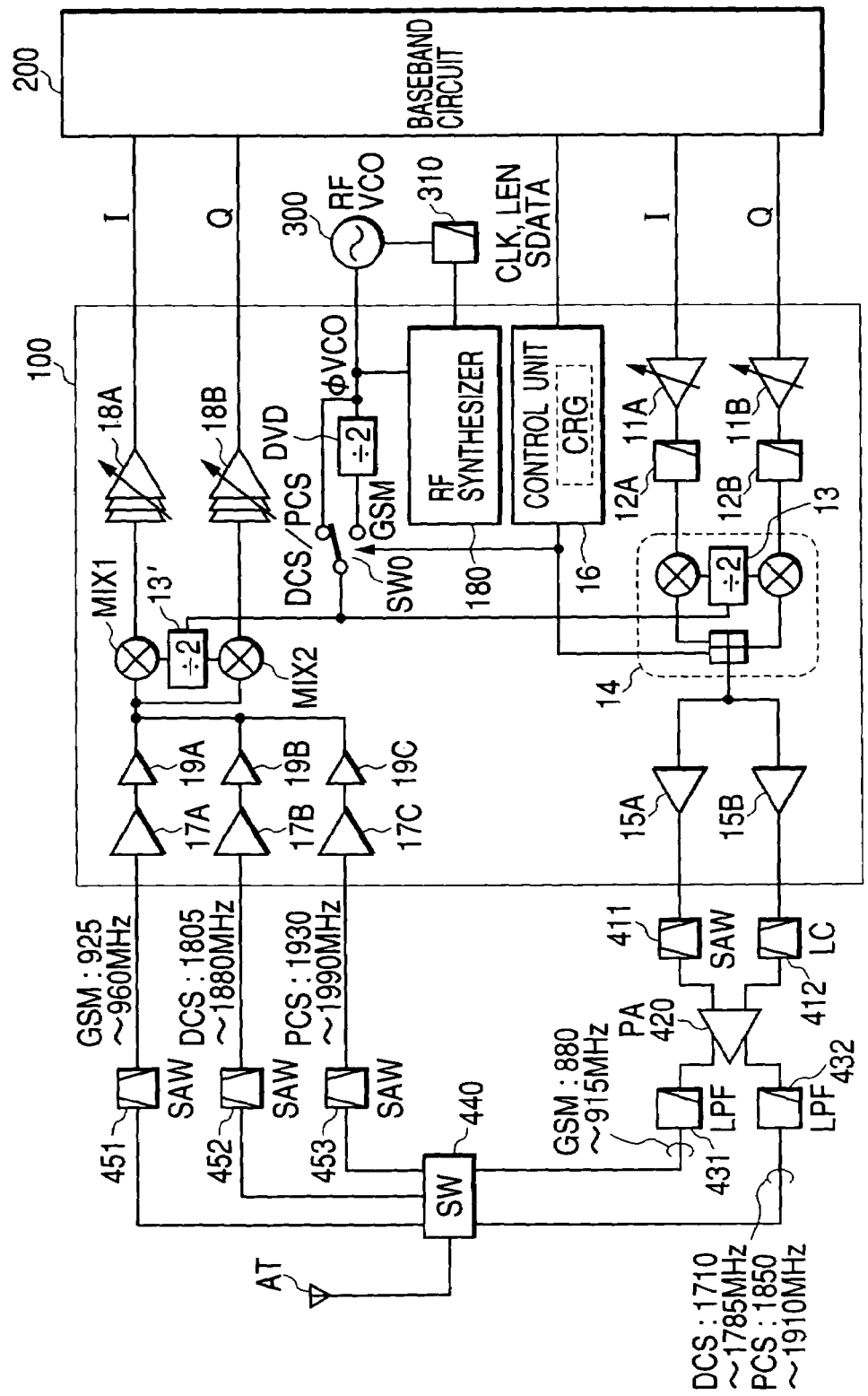
FIG. 12 is a block diagram of one example of wireless communication system using a modulating/demodulating LSI pertaining to the invention.

Next will be described with reference to FIG. 12 a typical configuration of a mobile communication system using a triple band type modulating/demodulating LSI using the transmission circuitry and the reception circuitry according to the present invention. The same circuits as in FIG. 1 will be assigned respectively the same reference signs, and duplication in description will be avoided. In FIG. 12, AT denotes an antenna for transmitting and receiving signal saves; 411 and 412 denote high frequency band-pass filters for clearing transmission signals of noise, such as a SAW filter or a LC filter; 420, a high frequency power amplifier circuit (power module) for amplifying transmission signals; 431 and 432, low-pass filters for clearing transmission signals of high frequency noise; 440, a switch for changing over between transmission and reception; 451 through 453, high frequency band-pass filters for clearing reception signals of unnecessary waves, such as SAW filters; 100, the modulating/demodulating LSI described with reference to the earlier embodiment; 200, a baseband circuit (LSI) for converting transmission data into I and Q signals and controlling the modulating/demodulating LSI 100; 300, a high frequency oscillator for use in both transmission and reception (RFVCO); and 310, a loop filter constituting a PLL circuit together with the RFVCO 300.

The modulating/demodulating LSI 100 is provided with an RF synthesizer 180 which, together with the local VCO 300 and the loop filter 310, constitutes the PLL circuit. This RF synthesizer 180 consists of a phase comparator circuit for comparing the phases of the VCO output and of a reference signal, a charge pump for generating a voltage matching the phase difference and other elements, and generates an oscillation signal $\phi$vco of a high frequency, such as 3.42 to 3.98 GHz. In a modulating/demodulating LSI for use in a multi-band communication system, switching over between transmission and reception is accomplished by the switching of the oscillation frequency of the PLL circuit according to the band to be used at an instruction from the baseband circuit 300. This oscillation signal $\phi$vco or a signal resulting from its ½ frequency division by the frequency dividing circuit DVD is supplied via a change-over switch SW0 to the frequency dividing phase shifter circuit 131 on the reception side or the frequency dividing phase shifter circuit 13 on the transmission side. The change-over switch SW0 is switched over by a control signal from the control circuit 16.

The control circuit 16 is provided with a control register CRG, and setting is performed in this register CRG on the basis of a signal from the baseband circuit 200. More specifically, a clock signal CLK for synchronization, a load enable signal LEN as the control signal and data signals SDATA are supplied from the baseband circuit 200 to the modulating/demodulating LSI 100, and the mode control circuit 16, when the load enable signal LEN is asserted to a valid level, the data signals SDATA transmitted from the baseband circuit 200 are successively taken in synchronously with the clock signal CLK to be set into the control register CRG. The data signals SDATA are serially transmitted, though not absolutely limited to serial transmission.

The control register CRG in the control circuit 16 is provided with bits including but not limited to a control bit for designating the band to be used in the above-described example of circuitry, and a mode selection bit for designating a reception mode, a transmission mode, an idle mode in which, as when waiting, only some of the circuits operate and most circuits including the oscillator circuit are stopped in a sleeping state, and a warm-up mode in which the PLL circuit is actuated.

FIG. 13 is a block diagram showing the overall configuration of a cellular phone to which the modulating/demodulating LSI of the above-described embodiment is applied.

The cellular phone in this example is provided with a liquid crystal panel 320 as the display unit, an antenna 321 for use in transmission and reception, a loudspeaker 322 for voice outputting, a microphone 323 for voice inputting, a liquid crystal control driver 311 for driving the liquid crystal panel 320 to display images, a voice interface 330 for causing the microphone 323 and the loudspeaker 322 to perform voice inputting/outputting, a high frequency interface 340 for performing cellular phone communication by a GSM formula or otherwise via the antenna 321, a digital signal processor (DSP) 351 for processing voice signals and transmission/reception signals, application specific integrated circuits (ASICs) 352 providing customized functions (user logic), a system control device 353 consisting of a microprocessor or a microcomputer for controlling the whole apparatus including display control, a memory 360 for storing data and programs, and an oscillator circuit (OSC) 370 among other elements. The DSP 351, the ASICs 352 and the microcomputer 353 as the system control device constitute the baseband circuit 200. The modulating/demodulating LSI in this embodiment is used as the transmitter/receiver unit for the high frequency interface 340. In the high frequency interface 340 are arranged a high frequency power amplifier (power module) and other elements in addition to the modulating/demodulating LSI 100.

While the invention achieved by the present invention has been hitherto described with reference to specific embodiments thereof, the invention is not limited to these embodiments. In the described embodiments, for instance, both the transmission circuitry and the reception circuitry are supposed to operate in a direct conversion formula, but the configuration may as well be such that only one of them operates in a direct conversion formula. Further, though the embodiment is supposed to use the circuit for generating oscillation signals (VCO or the like) in common for the transmission circuitry and for the reception circuitry, separate such circuits can be provided as well. Although the description of the embodiments referred to what uses a modulating/demodulating LSI adaptable to three bands including GSM, DCS 1800 and PCS 1900, the invention is also applicable to a modulating/demodulating LSI adaptable to two bands including GSM and DCS 1800, and a modulating/demodulating LSI adaptable to four or more bands.

Further the embodiment described above uses a variable capacitor Cv to vary the capacitance in order to alter the resonance point of the resonance circuit as the output load on the orthogonal modulating circuit 14 on the transmission side, it is also possible to alter the resonance point by varying the inductance.

Advantages achieved by some of the most typical aspects of the invention disclosed in the present application will be briefly described below.

Thus according to the invention, in the transmission circuitry of a direct up conversion formula, even if orthogonal modulating circuits to adapt to a plurality of bands are shared among multiple bands to restrain an increase in chip area, the requirement for noise characteristic (C/N ratio) can be satisfied. Also according to the invention, in the reception circuitry of a direct down conversion formula, even if low noise amplifiers (LNAs) for amplifying reception signals to adapt to a plurality of bands are shared among multiple bands to restrain an increase in chip area, it is possible to avoid deterioration in noise figure (NF). Furthermore, communication with signals of a plurality of frequency bands is possible, and there is no need for such external parts as a SAW filter and an IF-VCO for generating intermediate frequency oscillation signals. This also contributes to reducing the number of constituent parts.

INDUSTRIAL APPLICABILITY

Although the foregoing description mainly concerned the application of the invention by the present inventors to modulating/demodulating circuits for use in wireless communication systems including cellular phones, which constitute the area of utilization underlying the inventive attempt, the invention is not limited to them, but are extensively applicable to modulating/demodulating circuits in general.

The invention claimed is:

1. A semiconductor integrated circuit for communication with a built-in reception circuitry of a direct down conversion formula provided with mixer circuits for demodulating I signals and Q signals by synthesizing signals of two oscillation frequencies differing in phase from each other into reception signals, and performing demodulation of reception signals of a plurality of frequency bands by changing over the frequency of said oscillation frequency signals, wherein first stage amplifier circuits for amplifying reception signals respectively matching said plurality of frequency bands are provided, said mixer circuits are provided at a stage subsequent to said first stage amplifier circuits as common circuits for reception signals of said plurality of frequency bands, and buffer circuits whose outputs take on high impedances in their unselected state while matching to said first stage amplifier circuits are provided between said first stage amplifier circuits and said mixer circuits, wherein a variable gain amplifier circuit having an offset canceling circuit is provided on the output side of said mixer circuits, and a dummy amplifier circuit and a dummy buffer circuit having respectively the same configurations as said first stage amplifier circuits and buffer circuits but not involved in the amplification of reception signals are provided on the output side of said mixer circuits, and wherein said offset canceling circuit is so configured as to perform offset calibration in a state in which the genuine first stage amplifier circuits for amplifying reception signals and buffer circuits are placed in an inactive state and said dummy amplifier circuit and dummy buffer circuit are in an activated state.

* * * * *